US012575094B2

(12) United States Patent
Huang et al.

(10) Patent No.: US 12,575,094 B2
(45) Date of Patent: Mar. 10, 2026

(54) HIGH-SPEED MULTI-WRITE READ ONLY MEMORY ARRAY

(71) Applicant: YIELD MICROELECTRONICS CORP., Hsin-Chu County (TW)

(72) Inventors: Yu-Ting Huang, Hsin-Chu County (TW); Chi-Pei Wu, Hsin-Chu County (TW); Ya-Ting Fan, Hsin-Chu County (TW)

(73) Assignee: Yield Microelectronics Corp., Chu-pei (TW)

( * ) Notice: Subject to any disclaimer, the term of this patent is extended or adjusted under 35 U.S.C. 154(b) by 282 days.

(21) Appl. No.: 18/519,320

(22) Filed: Nov. 27, 2023

(65) Prior Publication Data

US 2025/0081450 A1    Mar. 6, 2025

(30) Foreign Application Priority Data

Sep. 5, 2023    (TW) ................................. 112133603

(51) Int. Cl.
*G11C 17/12* (2006.01)
*H10B 20/00* (2023.01)
(52) U.S. Cl.
CPC ........... *H10B 20/387* (2023.02); *G11C 17/12* (2013.01)

(58) Field of Classification Search
CPC ................................. G11C 7/12; H01B 20/387
USPC .......................................................... 365/104
See application file for complete search history.

(56) References Cited

U.S. PATENT DOCUMENTS

| | | | | |
|---|---|---|---|---|
| 7,075,140 B2 * | 7/2006 | Spadea | ................. | H10B 41/30 |
| | | | | 438/10 |
| 10,679,685 B2 * | 6/2020 | Hoang | ................ | G11C 11/1675 |
| 2008/0144347 A1 * | 6/2008 | Takemura | .............. | H10N 80/00 |
| | | | | 365/63 |
| 2021/0098072 A1 * | 4/2021 | Choi | ...................... | G11C 29/18 |
| 2021/0183872 A1 * | 6/2021 | Lai | ......................... | G11C 17/18 |

* cited by examiner

*Primary Examiner* — Muna A Techane
(74) *Attorney, Agent, or Firm* — Rosenberg, Klein & Lee

(57) ABSTRACT

A high-speed multi-write read only memory array includes word lines, select lines, bit lines, and sub-memory arrays. There are a first word line, a first select line, a second select line, a first bit line, a second bit line, a third bit line, and a fourth bit line. Each sub-memory array includes a first memory cell coupled to the first word line, the first select line, and the first bit line, a second memory cell coupled to the first word line, the first select line, and the second bit line, a third memory cell coupled to the first word line, the second select line, and the third bit line, and a fourth memory cell coupled to the first word line, the second select line, and the fourth bit line.

57 Claims, 8 Drawing Sheets

1

HIGH-SPEED MULTI-WRITE READ ONLY MEMORY ARRAY

BACKGROUND OF THE INVENTION

This application claims priority for the TW patent application No. 112133603 filed on 5 Sep. 2023, the content of which is incorporated by reference in its entirely.

FIELD OF THE INVENTION

The present invention relates to a memory array, particularly to a high-speed multi-write read only memory array.

DESCRIPTION OF THE RELATED ART

The Complementary Metal Oxide Semiconductor (CMOS) technology has been developed as a commonly used process for fabricating Application Specific Integrated Circuits (ASIC). Nowadays, as the computer information products are blooming, Electrically Erasable Programmable Read Only Memory (EEPROM) has been widely used in electronic products since the data stored within will not volatilize but can be erased and programmed electrically. In addition, the data will not disappear even after the power is turned off. As a result, the EEPROM is widely applied to electronic products.

Non-volatile memories are programmable and are able to adjust gate voltages of their transistors by storing charges, or to preserve the original gate voltages of transistors by not storing charges. When regarding to erase a non-volatile memory, the charges stored in the non-volatile memory are removed to resume the initial state of the memory, and return to its original gate voltages of the transistors. When the non-volatile memory is programmed, its internal switches will be turned off or turned on. In order to program the non-volatile memory array, a certain voltage and current need to be applied, so that the corresponding switches can be turned on or off. The reading, writing and erasing activities of the non-volatile memory are all operated at the drain. When writing and erasing, the drain operates at high voltage, which easily allows electrons to enter the gate, thereby changing the threshold voltage and reducing the number of writing activities. In addition, the voltage applied by the Fuller-Nordheim effect is relatively high and the corresponding speed is slow. Generally, the corresponding writing and erasing time is greater than 1 millisecond (ms).

To overcome the abovementioned problems, the present invention provides a high-speed multi-write read only memory array, so as to solve the afore-mentioned problems of the prior art.

SUMMARY OF THE INVENTION

The present invention provides a high-speed multi-write read only memory array.

In an embodiment of the present invention, a high-speed multi-write read only memory array is provided. The high-speed multi-write read only memory array includes a plurality of word lines, a plurality of select lines, a plurality of bit lines, and a plurality of sub-memory arrays. The word lines, arranged in parallel, include a first word line. The select lines are arranged in parallel and perpendicular to the word lines. The select lines include a first select line and a second select line. The bit lines are arranged in parallel. The bit lines parallel to the select lines include a first bit line, a second bit line, a third bit line, and a fourth bit line. The first select line is arranged between the first bit line and the second bit line. The second select line is arranged between the third bit line and the fourth bit line. Each of the sub-memory arrays, coupled to one word line, two select lines, and four bit lines, includes a first memory cell, a second memory cell, a third memory cell, and a fourth memory cell. The first memory cell is coupled to the first word line, the first bit line, and the first select line. The second memory cell is coupled to the first word line, the second bit line, and the first select line. The third memory cell is coupled to the first word line, the third bit line, and the second select line. The fourth memory cell is coupled to the first word line, the fourth bit line, and the second select line.

To sum up, the read only memory array reads the current of the memory cell from the source to identify the present storage state rather than read the current from the drain where high-voltage operation is performed, in order to reduce the impact of electrons entering the gate to change the threshold voltage. Compared with the Fowler-Nordheim tunneling, the read-only memory array can use a lower voltage to achieve high-speed writing and multi-write purposes.

Below, the embodiments are described in detail in cooperation with the drawings to make easily understood the technical contents, characteristics and accomplishments of the present invention.

DETAILED DESCRIPTION OF THE INVENTION

In the following description, a high-speed multi-write read only memory array will be provided, which reads the current of the memory cell from the source to identify the present storage state rather than read the current from the drain where high-voltage operation is performed, in order to reduce the impact of electrons entering the gate to change the threshold voltage. Compared with the Fowler-Nordheim tunneling, the read-only memory array can use a lower voltage to achieve high-speed writing and multi-write purposes.

Figure 1:
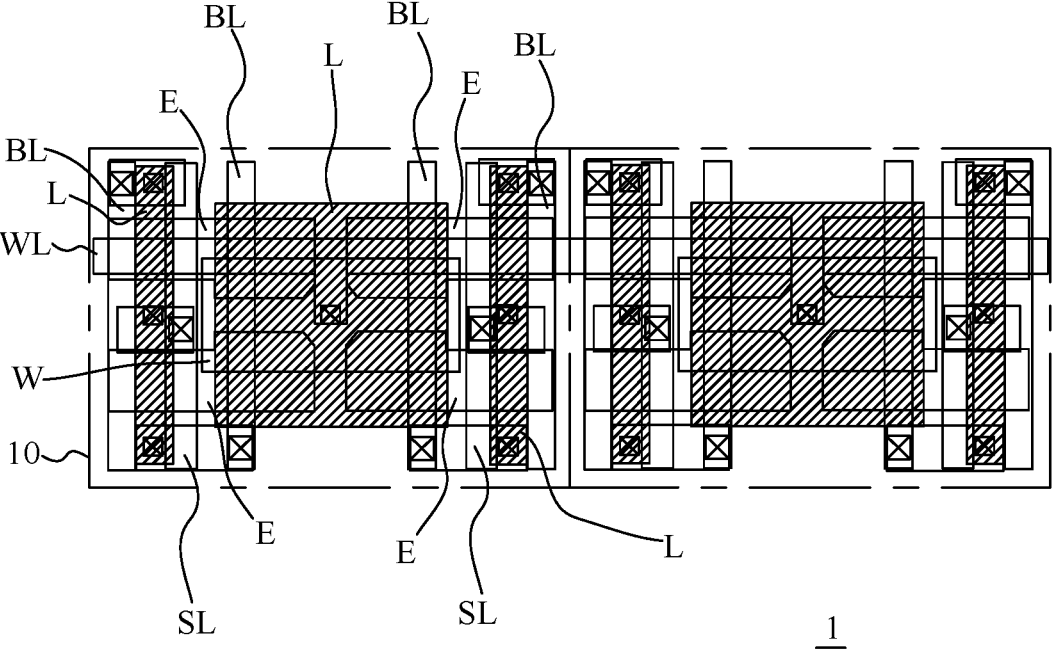
FIG. 1 is a schematic diagram illustrating the circuit layout of a high-speed multi-write read only memory array according to an embodiment of the present invention.
Figure 2:
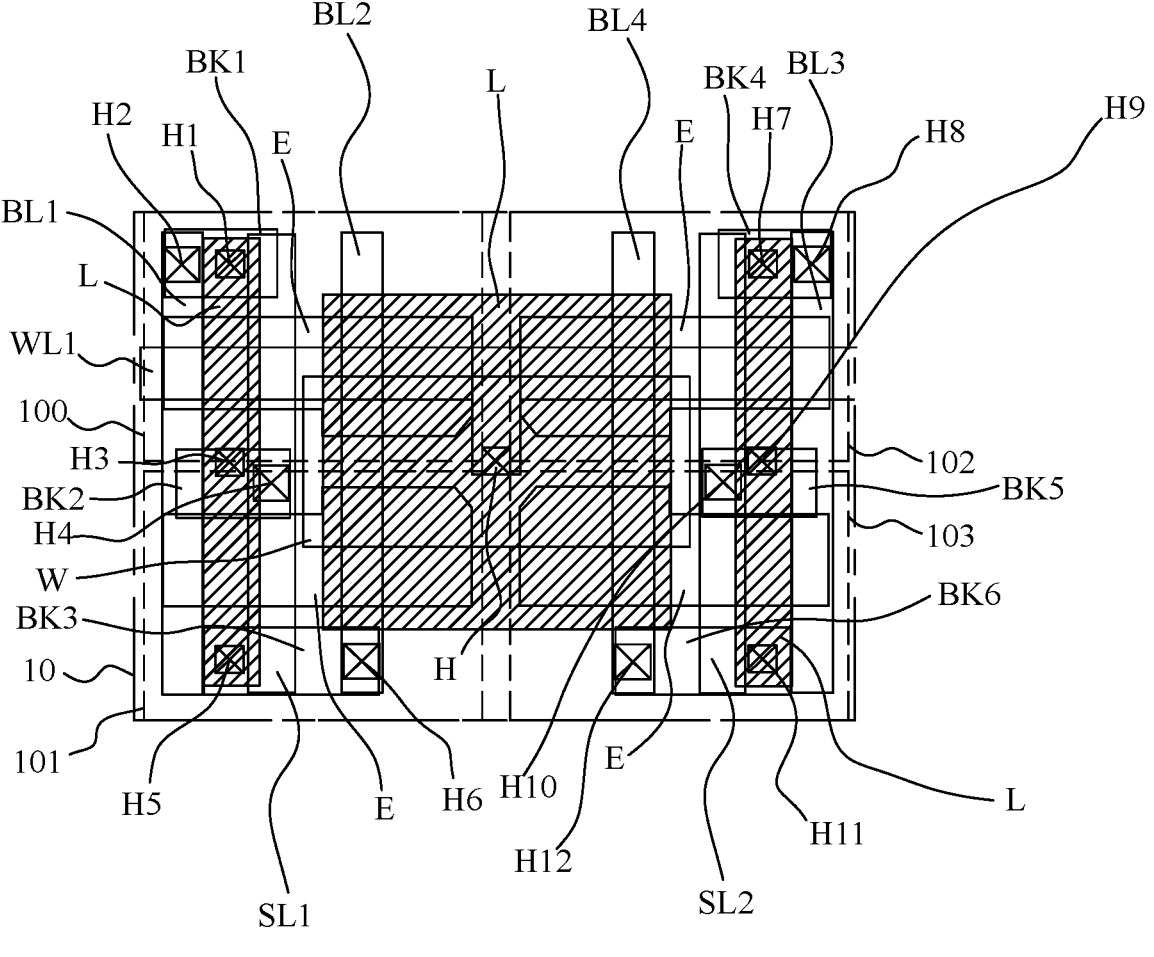
FIG. 2 is a schematic diagram illustrating the circuit layout of a sub-memory array according to an embodiment of the present invention.

FIG. 1 is a schematic diagram illustrating the circuit layout of a high-speed multi-write read only memory array according to an embodiment of the present invention. FIG. 2 is a schematic diagram illustrating the circuit layout of a sub-memory array according to an embodiment of the present invention. Referring to FIG. 1 and FIG. 2, a high-speed multi-write read only memory array 1 of the present invention is introduced as follows. The high-speed multi-write read only memory array 1 includes a plurality of word lines WL arranged in parallel, a plurality of select lines SL arranged in parallel, a plurality of bit lines BL arranged in parallel, and a plurality of sub-memory arrays 10. The word lines WL includes a first word line WL1. The word lines WL are perpendicular to the select lines SL. The select lines SL include a first select line SL1 and a second select line SL2. The bit lines BL are parallel to the select lines SL. The bit lines BL include a first bit line BL1, a second bit line BL2, a third bit line BL3, and a fourth bit line BL4. The first select line SL1 is arranged between the first bit line BL1 and the second bit line BL2. The second select line SL2 is arranged between the third bit line BL3 and the fourth bit line BL4. Each sub-memory array 10, coupled to one word line WL, two select lines SL, and four bit lines BL, includes a first memory cell 100, a second memory cell 101, a third memory cell 102, and a fourth memory cell 103. The first memory cell 100 is coupled to the first word line WL1, the first bit line BL1, and the first select line SL1. The second memory cell 101 is coupled to the first word line WL1, the second bit line BL2, and the first select line SL1. The third memory cell 102 is coupled to the first word line WL1, the third bit line BL3, and the second select line SL2. The fourth memory cell 103 is coupled to the first word line WL1, the fourth bit line BL4, and the second select line SL2. In some embodiments of the present invention, the first memory cell 100 and the second memory cell 101 are arranged symmetric to each other, the first memory cell 100 and the third memory cell 102 are arranged symmetric to each other, the fourth memory cell 103 and the second memory cell 101 are arranged symmetric to each other, and the fourth memory cell 103 and the third memory cell 102 are arranged symmetric to each other.

Figure 3:
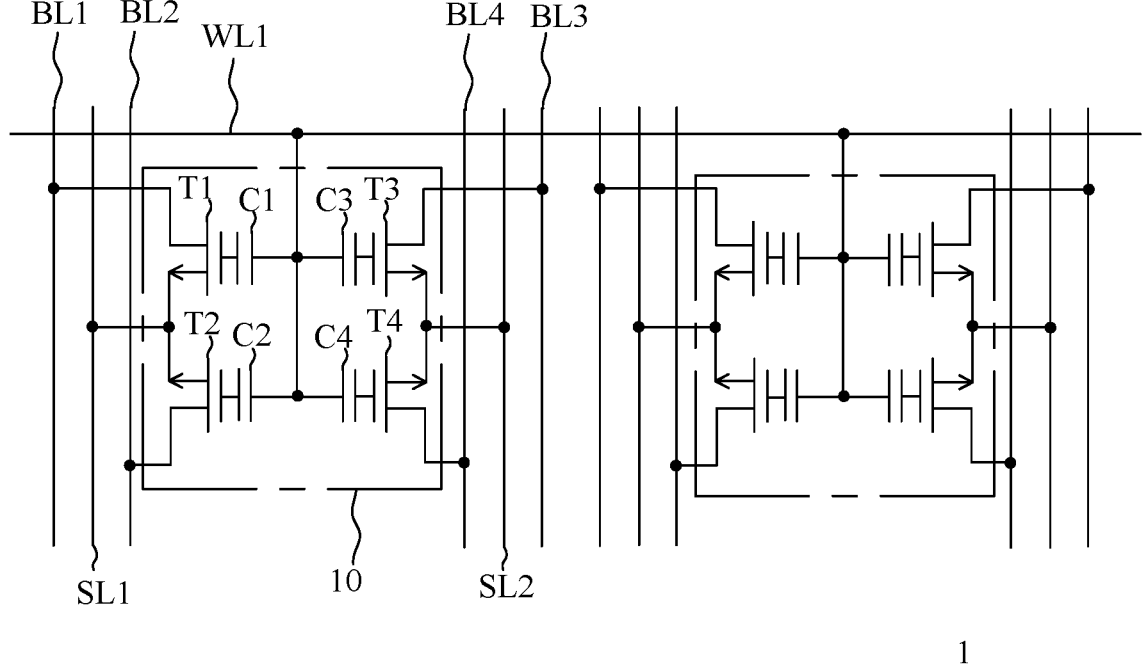
FIG. 3 is a schematic diagram illustrating the equivalent circuit of a high-speed multi-write read only memory array according to an embodiment of the present invention.
Figure 4:
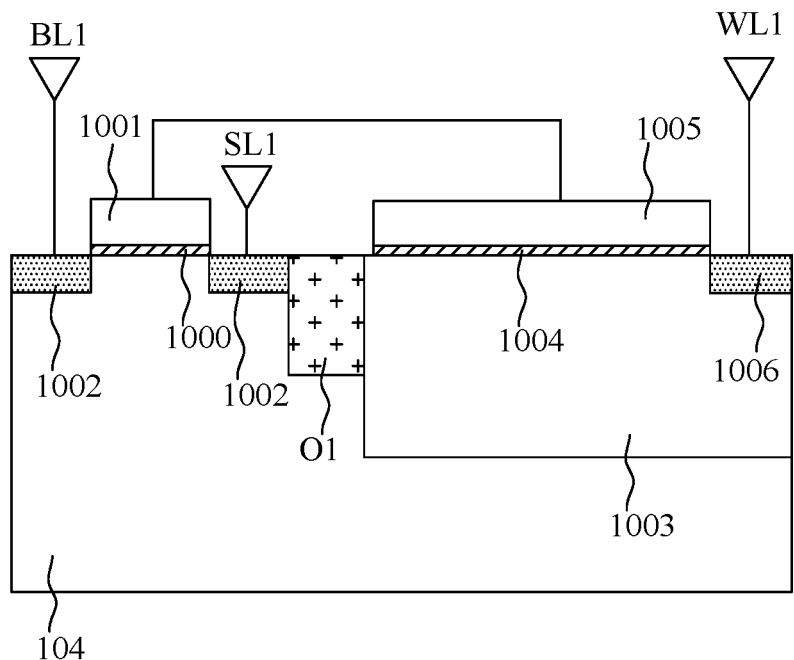
FIG. 4 is a cross-sectional view of a first memory cell according to an embodiment of the present invention.

FIG. 3 is a schematic diagram illustrating the equivalent circuit of a high-speed multi-write read only memory array according to an embodiment of the present invention. FIG. 4 is a cross-sectional view of a first memory cell according to an embodiment of the present invention. Referring to FIG. 2, FIG. 3 and FIG. 4, the first memory cell 100, the second memory cell 101, the third memory cell 102, and the fourth memory cell 103 are formed in a semiconductor region 104 having a first conductivity type. The semiconductor region 104 is exemplified by a semiconductor substrate. The first memory cell 100 may include a first field-effect transistor T1 and a first capacitor structure C1. The first field-effect transistor T1, the first capacitor structure C1, and a first insulation structure O1 are formed in the semiconductor region 104. The first insulation structure O1, arranged between the first field-effect transistor T1 and the first capacitor structure C1, separates the first field-effect transistor T1 from the first capacitor structure C1. The first field-effect transistor T1 includes a first gate dielectric block 1000, a first conduction gate 1001, and two first heavily-doped regions 1002. The first gate dielectric block 1000 is a part of a dielectric layer L. The first conduction gate 1001 is a part of an electrode layer E. The first heavily-doped regions 1002 have a second conductivity type opposite to the first conductivity type. In the embodiment, the first conductivity type is a P type and the second conductivity type is an N type. The first gate dielectric block 1000 is formed on the semiconductor region 104. The first conduction gate 1001 is formed on the first gate dielectric block 1000. The first heavily-doped regions 1002 are formed in the semiconductor region 104 and respectively formed on two opposite side of the semiconductor region 104, which is directly arranged under the first conduction gate 1001. The first heavily-doped regions 1002 are respectively coupled to the first bit line BL1 and the first select line SL1. The first heavily-doped region 1002 coupled to the first bit line BL1 is used as a drain and the first heavily-doped region 1002 coupled to the first select line SL1 is used as a source. The first capacitor structure C1 includes a first well 1003, a first dielectric block 1004, and a first electrode block 1005. The first well 1003 is a part of a common well W. The first dielectric block 1004 is a part of the dielectric layer L. The first electrode block 1005 is a part of the electrode layer E. The common well W and the first well 1003 have the second conductivity type. The first well 1003 is formed in the semiconductor region 104 and coupled to the first word line WL1. The first dielectric block 1004 is formed on the surface of the first well 1003. The first electrode block 1005 is stacked on the first dielectric block 1004 and coupled to the first conduction gate 1001. In some embodiments, the first capacitor structure C1 may further include a heavily-doped region 1006 in order to form an ohmic contact. The heavily-doped region 1006, having the second conductivity type, is formed in the first well 1003 and coupled to the first word line WL1. The word lines WL in FIG. 1, a first conduction block BK1, and a second conduction block BK2 are a part of a first conduction metal layer. The bit lines BL and the select lines SL in FIG. 1 are a part of a second conduction metal layer. The electrode layer E, the first conduction metal layer, and the second conduction metal layer are sequentially arranged from bottom to top. The first conduction block BK1 overlaps a first conduction via H1 and a second conduction via H2. One end of the first conduction via H1 is coupled to an external voltage and another end of the first conduction via H1 penetrates through the dielectric layer L and sequentially couples to the first conduction block BK1, the second conduction via H2, and the first bit line BL1. In other words, the first conduction via H1, the first conduction block BK1, the second conduction via H2, and the first bit line BL1 are sequentially arranged from bottom to top. The second conduction block BK2 overlaps a third conduction via H3 and a fourth conduction via H4. One end of the third conduction via H3 is coupled to an external voltage and another end of the third conduction via H3 penetrates through the dielectric layer L and sequentially couples to the second conduction block BK2, the fourth conduction via H4, and the first select line SL1. In other words, the third conduction via H3, the second conduction block BK2, the fourth conduction via H4, and the first select line SL1 are sequentially arranged from bottom to top. The first word line WL1, a conduction via H, the common well W, and the dielectric layer L overlap each other. One end of the conduction via H is coupled to the first word line WL1 and another end of the conduction via H is coupled to an external voltage. The conduction via H penetrates through the common well W and the dielectric layer L.

The operation of the first memory cell 100 is introduced as follows. The operation includes a programming activity, an erasing activity, and a reading activity. The select line or the word line is coupled to a low voltage or a grounding voltage depending on process characteristics.

When the first memory cell 100 is selected to perform a programming activity, the semiconductor region 104 receives a grounding voltage, the first bit line BL1 and the first word line WL1 receive a high voltage, and the first select line SL1 receives a low voltage or the grounding voltage. When the first memory cell 100 is not selected to perform a programming activity, the semiconductor region 104 receives the grounding voltage, the first bit line BL1 is electrically floating, the first word line WL1 receives the low voltage or the grounding voltage, and the first select line SL1 receives a middle voltage. When the first memory cell 100 is selected to perform an erasing activity, the semiconductor region 104 receives the grounding voltage, the first bit line BL1 receives the high voltage, the first word line WL1 receives the grounding voltage or the low voltage, and the first select line SL1 receives the grounding voltage. When the first memory cell 100 is not selected to perform an erasing activity, the semiconductor region 104 receives the grounding voltage, the first bit line BL1 is electrically floating, the first word line WL1 receives the grounding voltage or the low voltage, and the first select line SL1 receives the middle voltage. When the first memory cell 100 is selected to perform a reading activity, the semiconductor region 104 and the first bit line BL1 receive the grounding voltage and the first word line WL1 and the first select line SL1 receive the low voltage. When the first memory cell 100 is not selected to perform a reading activity, the semiconductor region 104 and the first word line WL1 receive the grounding voltage, the first bit line BL1 receives the low voltage, and the first select line SL1 is electrically floating. In the foregoing operation, the high voltage is higher than the middle voltage, the middle voltage is higher than the low voltage, and the low voltage is higher than the grounding voltage. Specifically, the high voltage is slightly lower than the drain-to-source breakdown voltage of the first field-effect transistor T1. That is to say, the high voltage is equal to the drain-to-source breakdown voltage of the first field-effect transistor T1 minus the threshold voltage of the first field-effect transistor T1. The middle voltage is equal to the drain-to-source breakdown voltage of the first field-effect transistor T1×0.5. The low voltage is equal to the drain-to-source breakdown voltage of the first field-effect transistor T1×0.25. The grounding voltage is a zero voltage. Based on the forgoing operation, the first memory cell 100 reads the current from the source of the first field-effect transistor T1 to identify the present storage state rather than read the current from the drain where high-voltage operation is performed, in order to reduce the impact of electrons entering the gate to change the threshold voltage. Compared with the Fowler-Nordheim tunneling, the read-only memory array 1 can use a lower voltage to achieve high-speed writing and multi-write purposes.

Figure 5:
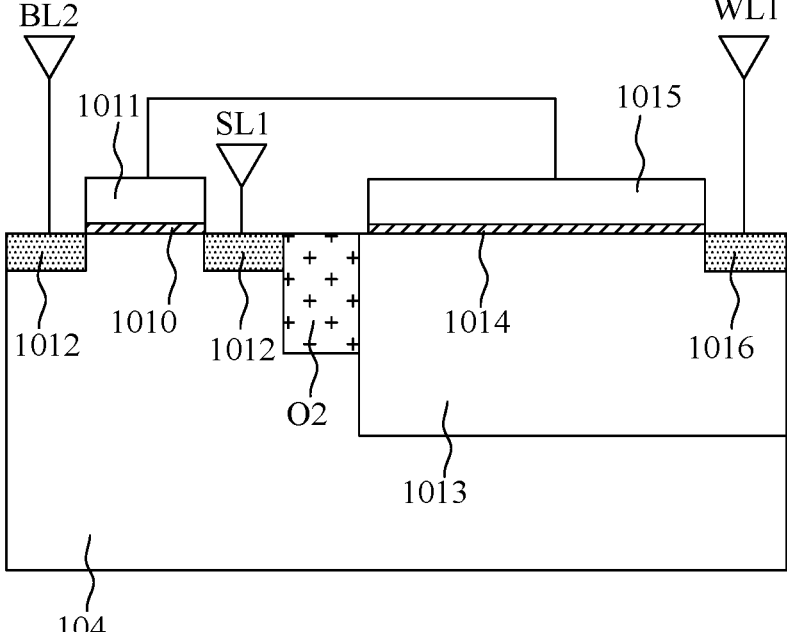
FIG. 5 is a cross-sectional view of a second memory cell according to an embodiment of the present invention.

FIG. 5 is a cross-sectional view of a second memory cell according to an embodiment of the present invention. Referring to FIG. 2, FIG. 3 and FIG. 5, the second memory cell 101 may include a second field-effect transistor T2 and a second capacitor structure C2. The second field-effect transistor T2, the second capacitor structure C2, and a second insulation structure O2 are formed in the semiconductor region 104. The second insulation structure O2, arranged between the second field-effect transistor T2 and the second capacitor structure C2, separates the second field-effect transistor T2 from the second capacitor structure C2. The second field-effect transistor T2 includes a second gate dielectric block 1010, a second conduction gate 1011, and two second heavily-doped regions 1012. The second gate dielectric block 1010 is a part of the dielectric layer L. The second conduction gate 1011 is a part of the electrode layer E. The second heavily-doped regions 1012 have the second conductivity type. The second gate dielectric block 1010 is formed on the semiconductor region 104. The second conduction gate 1011 is formed on the second gate dielectric block 1010. The second heavily-doped regions 1012 are formed in the semiconductor region 104 and respectively formed on two opposite side of the semiconductor region 104, which is directly arranged under the second conduction gate 1011. The second heavily-doped regions 1012 are respectively coupled to the second bit line BL2 and the first select line SL1. The second heavily-doped region 1012 coupled to the second bit line BL2 is used as a drain and the second heavily-doped region 1012 coupled to the first select line SL1 is used as a source. The second capacitor structure C2 includes a second well 1013, a second dielectric block 1014, and a second electrode block 1015. The second well 1013 is a part of the common well W. The second dielectric block 1014 is a part of the dielectric layer L. The second electrode block 1015 is a part of the electrode layer E. The second well 1013 has the second conductivity type. The second well 1013 is formed in the semiconductor region 104 and coupled to the first word line WL1. The second dielectric block 1014 is formed on the surface of the second well 1013. The second electrode block 1015 is stacked on the second dielectric block 1014 and coupled to the second conduction gate 1011. In some embodiments, the second capacitor structure C2 may further include a heavily-doped region 1016 in order to form an ohmic contact. The heavily-doped region 1016, having the second conductivity type, is formed in the second well 1013 and coupled to the first word line WL1. A third conduction block BK3 is a part of the first conduction metal layer. The third conduction block BK3 overlaps a fifth conduction via H5 and a sixth conduction via H6. One end of the fifth conduction via H5 is coupled to an external voltage and another end of the fifth conduction via H5 penetrates through the dielectric layer L and sequentially couples to the third conduction block BK3, the sixth conduction via H6, and the second bit line BL2. In other words, the fifth conduction via H5, the third conduction block BK3, the sixth conduction via H6, and the second bit line BL2 are sequentially arranged from bottom to top.

The operation of the second memory cell 101 is introduced as follows. The operation includes a programming activity, an erasing activity, and a reading activity. The select line or the word line is coupled to a low voltage or a grounding voltage depending on process characteristics.

When the second memory cell 101 is selected to perform a programming activity, the semiconductor region 104 receives a grounding voltage, the second bit line BL2 and the first word line WL1 receive a high voltage, and the first select line SL1 receives a low voltage or the grounding voltage. When the second memory cell 101 is not selected to perform a programming activity, the semiconductor region 104 receives the grounding voltage, the second bit line BL2 is electrically floating, the first word line WL1 receives the low voltage or the grounding voltage, and the first select line SL1 receives a middle voltage. When the second memory cell 101 is selected to perform an erasing activity, the semiconductor region 104 receives the grounding voltage, the second bit line BL2 receives the high voltage, the first word line WL1 receives the grounding voltage or the low voltage, and the first select line SL1 receives the grounding voltage. When the second memory cell 101 is not selected to perform an erasing activity, the semiconductor region 104 receives the grounding voltage, the second bit line BL2 is electrically floating, the first word line WL1 receives the grounding voltage or the low voltage, and the first select line SL1 receives the middle voltage. When the second memory cell 101 is selected to perform a reading activity, the semiconductor region 104 and the second bit line BL2 receive the grounding voltage and the first word line WL1 and the first select line SL1 receive the low voltage. When the second memory cell 101 is not selected to perform a reading activity, the semiconductor region 104 and the first word line WL1 receive the grounding voltage, the second bit line BL2 receives the low voltage, and the first select line SL1 is electrically floating. In the foregoing operation, the high voltage is higher than the middle voltage, the middle voltage is higher than the low voltage, and the low voltage is higher than the grounding voltage. Specifically, the high voltage is slightly lower than the drain-to-source breakdown voltage of the second field-effect transistor T2. That is to say, the high voltage is equal to the drain-to-source breakdown voltage of the second field-effect transistor T2 minus the threshold voltage of the second field-effect transistor T2. The middle voltage is equal to the drain-to-source breakdown voltage of the second field-effect transistor T2×0.5. The low voltage is equal to the drain-to-source breakdown voltage of the second field-effect transistor T2×0.25. The grounding voltage is a zero voltage. Based on the forgoing operation, the second memory cell 101 reads the current from the source of the second field-effect transistor T2 to identify the present storage state rather than read the current from the drain where high-voltage operation is performed, in order to reduce the impact of electrons entering the gate to change the threshold voltage. Compared with the Fowler-Nordheim tunneling, the read-only memory array 1 can use a lower voltage to achieve high-speed writing and multi-write purposes.

Figure 6:
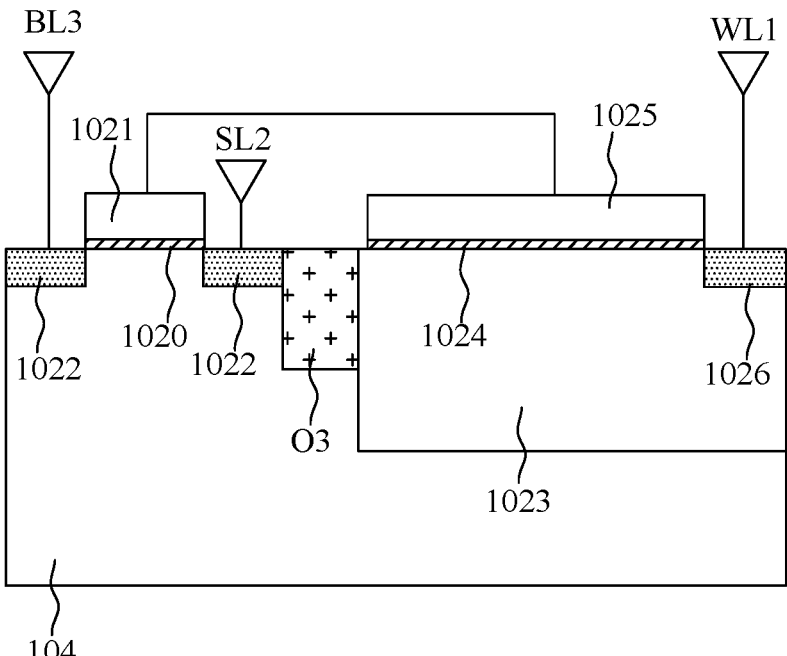
FIG. 6 is a cross-sectional view of a third memory cell according to an embodiment of the present invention.

FIG. 6 is a cross-sectional view of a third memory cell according to an embodiment of the present invention. Referring to FIG. 2, FIG. 3 and FIG. 6, the third memory cell 102 may include a third field-effect transistor T3 and a third capacitor structure C3. The third field-effect transistor T3, the third capacitor structure C3, and a third insulation structure O3 are formed in the semiconductor region 104. The third insulation structure O3, arranged between the third field-effect transistor T3 and the third capacitor structure C3, separates the third field-effect transistor T3 from the third capacitor structure C3. The third field-effect transistor T3 includes a third gate dielectric block 1020, a third conduction gate 1021, and two third heavily-doped regions 1022. The third gate dielectric block 1020 is a part of the dielectric layer L. The third conduction gate 1021 is a part of the electrode layer E. The third heavily-doped regions 1022 have the second conductivity type. The third gate dielectric block 1020 is formed on the semiconductor region 104. The third conduction gate 1021 is formed on the third gate dielectric block 1020. The third heavily-doped regions 1022 are formed in the semiconductor region 104 and respectively formed on two opposite side of the semiconductor region 104, which is directly arranged under the third conduction gate 1021. The third heavily-doped regions 1022 are respectively coupled to the third bit line BL3 and the second select line SL2. The third heavily-doped region 1022 coupled to the third bit line BL3 is used as a drain and the third heavily-doped region 1022 coupled to the second select line SL2 is used as a source. The third capacitor structure C3 includes a third well 1023, a third dielectric block 1024, and a third electrode block 1025. The third well 1023 is a part of the common well W. The third dielectric block 1024 is a part of the dielectric layer L. The third electrode block 1025 is a part of the electrode layer E. The common well W and the third well 1023 have the second conductivity type. The third well 1023 is formed in the semiconductor region 104 and coupled to the first word line WL1. The third dielectric block 1024 is formed on the surface of the third well 1023. The third electrode block 1025 is stacked on the third dielectric block 1024 and coupled to the third conduction gate 1021. In some embodiments, the third capacitor structure C3 may further include a heavily-doped region 1026 in order to form an ohmic contact. The heavily-doped region 1026, having the second conductivity type, is formed in the third well 1023 and coupled to the first word line WL1. A fourth conduction block BK4 and a fifth conduction block BK5 are a part of the first conduction metal layer. The fourth conduction block BK4 overlaps a seventh conduction via H7 and an eighth conduction via H8. One end of the seventh conduction via H7 is coupled to an external voltage and another end of the seventh conduction via H7 penetrates through the dielectric layer L and sequentially couples to the fourth conduction block BK4, an eighth conduction via H8, and the third bit line BL3. In other words, the seventh conduction via H7, the fourth conduction block BK4, the eighth conduction via H8, and the third bit line BL3 are sequentially arranged from bottom to top. The fifth conduction block BK5 overlaps a ninth conduction via H9 and a tenth conduction via H10. One end of the ninth conduction via H9 is coupled to an external voltage and another end of the ninth conduction via H9 penetrates through the dielectric layer L and sequentially couples to the fifth conduction block BK5, the tenth conduction via H10, and the second select line SL2. In other words, the ninth conduction via H9, the fifth conduction block BK5, the tenth conduction via H10, and the second select line SL2 are sequentially arranged from bottom to top.

The operation of the third memory cell 102 is introduced as follows. The operation includes a programming activity, an erasing activity, and a reading activity. The select line or the word line is coupled to a low voltage or a grounding voltage depending on process characteristics.

When the third memory cell 102 is selected to perform a programming activity, the semiconductor region 104 receives a grounding voltage, the third bit line BL3 and the first word line WL1 receive a high voltage, and the second select line SL2 receives a low voltage or the grounding voltage. When the third memory cell 102 is not selected to perform a programming activity, the semiconductor region 104 receives the grounding voltage, the third bit line BL3 is electrically floating, the first word line WL1 receives the low voltage or the grounding voltage, and the second select line SL2 receives a middle voltage. When the third memory cell 102 is selected to perform an erasing activity, the semiconductor region 104 receives the grounding voltage, the third bit line BL3 receives the high voltage, the first word line WL1 receives the grounding voltage or the low voltage, and the second select line SL2 receives the grounding voltage. When the third memory cell 102 is not selected to perform an erasing activity, the semiconductor region 104 receives the grounding voltage, the third bit line BL3 is electrically floating, the first word line WL1 receives the grounding voltage or the low voltage, and the second select line SL2 receives the middle voltage. When the third memory cell 102 is selected to perform a reading activity, the semiconductor region 104 and the third bit line BL3 receive the grounding voltage and the first word line WL1 and the second select line SL2 receive the low voltage. When the third memory cell 102 is not selected to perform a reading activity, the semiconductor region 104 and the first word line WL1 receive the grounding voltage, the third bit line BL3 receives the low voltage, and the second select line SL2 is electrically floating. In the foregoing operation, the high voltage is higher than the middle voltage, the middle voltage is higher than the low voltage, and the low voltage is higher than the grounding voltage. Specifically, the high voltage is slightly lower than the drain-to-source breakdown voltage of the third field-effect transistor T3. That is to say, the high voltage is equal to the drain-to-source breakdown voltage of the third field-effect transistor T3 minus the threshold voltage of the third field-effect transistor T3. The middle voltage is equal to the drain-to-source breakdown voltage of the third field-effect transistor T3×0.5. The low voltage is equal to the drain-to-source breakdown voltage of the third field-effect transistor T3×0.25. The grounding voltage is a zero voltage. Based on the forgoing operation, the third memory cell 102 reads the current from the source of the third field-effect transistor T3 to identify the present storage state rather than read the current from the drain where high-voltage operation is performed, in order to reduce the impact of electrons entering the gate to change the threshold voltage. Compared with the Fowler-Nordheim tunneling, the read-only memory array 1 can use a lower voltage to achieve high-speed writing and multi-write purposes.

Figure 7:
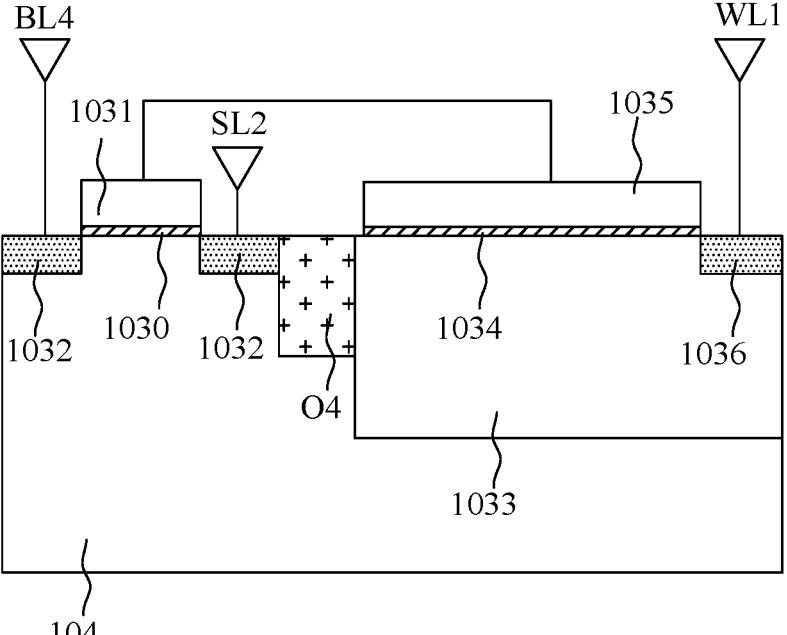
FIG. 7 is a cross-sectional view of a fourth memory cell according to an embodiment of the present invention.

FIG. 7 is a cross-sectional view of a fourth memory cell according to an embodiment of the present invention. Referring to FIG. 2, FIG. 3 and FIG. 7, the fourth memory cell 103 may include a fourth field-effect transistor T4 and a fourth capacitor structure C4. The fourth field-effect transistor T4, the fourth capacitor structure C4, and a fourth insulation structure O4 are formed in the semiconductor region 104. The fourth insulation structure O4, arranged between the fourth field-effect transistor T4 and the fourth capacitor structure C4, separates the fourth field-effect transistor T4 from the fourth capacitor structure C4. The fourth field-effect transistor T4 includes a fourth gate dielectric block 1030, a fourth conduction gate 1031, and two fourth heavily-doped regions 1032. The fourth gate dielectric block 1030 is a part of the dielectric layer L. The fourth conduction gate 1031 is a part of the electrode layer E. The fourth heavily-doped regions 1032 have the second conductivity type. The fourth gate dielectric block 1030 is formed on the semiconductor region 104. The fourth conduction gate 1031 is formed on the fourth gate dielectric block 1030. The fourth heavily-doped regions 1032 are formed in the semiconductor region 104 and respectively formed on two opposite side of the semiconductor region 104, which is directly arranged under the fourth conduction gate 1031. The fourth heavily-doped regions 1032 are respectively coupled to the fourth bit line BL4 and the second select line SL2. The fourth heavily-doped region 1032 coupled to the fourth bit line BL4 is used as a drain and the fourth heavily-doped region 1032 coupled to the second select line SL2 is used as a source. The fourth capacitor structure C4 includes a fourth well 1033, a fourth dielectric block 1034, and a fourth electrode block 1035. The fourth well 1033 is a part of the common well W. The fourth dielectric block 1034 is a part of the dielectric layer L. The fourth electrode block 1035 is a part of the electrode layer E. The fourth well 1033 has the second conductivity type. The fourth well 1033 is formed in the semiconductor region 104 and coupled to the first word line WL1. The fourth dielectric block 1034 is formed on the surface of the fourth well 1033. The fourth electrode block 1035 is stacked on the fourth dielectric block 1034 and coupled to the fourth conduction gate 1031. In some embodiments, the fourth capacitor structure C4 may further include a heavily-doped region 1036 in order to form an ohmic contact. The heavily-doped region 1036, having the second conductivity type, is formed in the fourth well 1033 and coupled to the first word line WL1. A sixth conduction block BK6 is a part of the first conduction metal layer. The sixth conduction block BK6 overlaps an eleventh conduction via H11 and a twelfth conduction via H12. One end of the eleventh conduction via H11 is coupled to an external voltage and another end of the eleventh conduction via H11 penetrates through the dielectric layer L and sequentially couples to the sixth conduction block BK6, the twelfth conduction via H12, and the fourth bit line BL4. In other words, the eleventh conduction via H11, the sixth conduction block BK6, the twelfth conduction via H12, and the fourth bit line BL4 are sequentially arranged from bottom to top.

The operation of the fourth memory cell 103 is introduced as follows. The operation includes a programming activity, an erasing activity, and a reading activity. The select line or the word line is coupled to a low voltage or a grounding voltage depending on process characteristics.

When the fourth memory cell 103 is selected to perform a programming activity, the semiconductor region 104 receives a grounding voltage, the fourth bit line BL4 and the first word line WL1 receive a high voltage, and the second select line SL2 receives a low voltage or the grounding voltage. When the fourth memory cell 103 is not selected to perform a programming activity, the semiconductor region 104 receives the grounding voltage, the fourth bit line BL4 is electrically floating, the first word line WL1 receives the low voltage or the grounding voltage, and the second select line SL2 receives a middle voltage. When the fourth memory cell 103 is selected to perform an erasing activity, the semiconductor region 104 receives the grounding voltage, the fourth bit line BL4 receives the high voltage, the first word line WL1 receives the grounding voltage or the low voltage, and the second select line SL2 receives the grounding voltage. When the fourth memory cell 103 is not selected to perform an erasing activity, the semiconductor region 104 receives the grounding voltage, the fourth bit line BL4 is electrically floating, the first word line WL1 receives the grounding voltage or the low voltage, and the second select line SL2 receives the middle voltage. When the fourth memory cell 103 is selected to perform a reading activity, the semiconductor region 104 and the fourth bit line BL4 receive the grounding voltage and the first word line WL1 and the second select line SL2 receive the low voltage. When the fourth memory cell 103 is not selected to perform a reading activity, the semiconductor region 104 and the first word line WL1 receive the grounding voltage, the fourth bit line BL4 receives the low voltage, and the second select line SL2 is electrically floating. In the foregoing operation, the high voltage is higher than the middle voltage, the middle voltage is higher than the low voltage, and the low voltage is higher than the grounding voltage. Specifically, the high voltage is slightly lower than the drain-to-source breakdown voltage of the fourth field-effect transistor T4. That is to say, the high voltage is equal to the drain-to-source breakdown voltage of the fourth field-effect transistor T4 minus the threshold voltage of the fourth field-effect transistor T4. The middle voltage is equal to the drain-to-source breakdown voltage of the fourth field-effect transistor T4×0.5. The low voltage is equal to the drain-to-source breakdown voltage of the fourth field-effect transistor T4×0.25. The grounding voltage is a zero voltage. Based on the forgoing operation, the fourth memory cell 103 reads the current from the source of the fourth field-effect transistor T4 to identify the present storage state rather than read the current from the drain where high-voltage operation is performed, in order to reduce the impact of electrons entering the gate to change the threshold voltage. Compared with the Fowler-Nordheim tunneling, the read-only memory array 1 can use a lower voltage to achieve high-speed writing and multi-write purposes.

Figure 8:
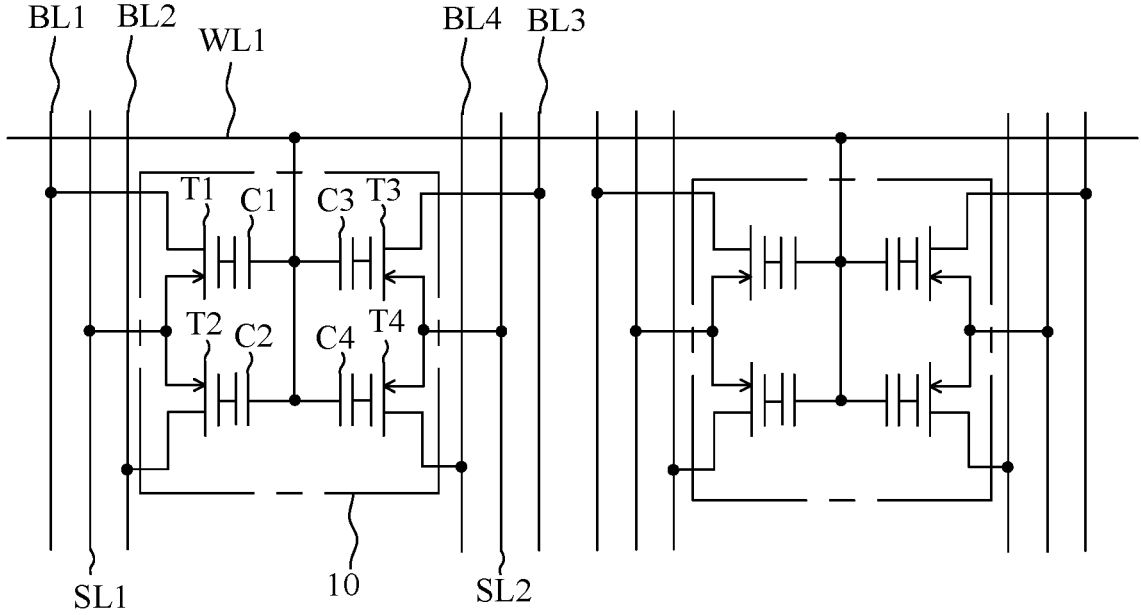
FIG. 8 is a schematic diagram illustrating the equivalent circuit of a high-speed multi-write read only memory array according to another embodiment of the present invention.

FIG. 8 is a schematic diagram illustrating the equivalent circuit of a high-speed multi-write read only memory array according to another embodiment of the present invention. Please refer to FIG. 2, FIG. 4, and FIG. 8. In the embodiment, the first conductivity type is an N type and the second conductivity type is a P type. The operation of the first memory cell 100 is introduced as follows. The operation includes a programming activity, an erasing activity, and a reading activity. The select line or the word line is coupled to a middle voltage or a high voltage depending on process characteristics.

When the first memory cell 100 is selected to perform a programming activity, the semiconductor region 104 receives a high voltage, the first bit line BL1 and the first word line WL1 receive a grounding voltage, and the first select line SL1 receives a middle voltage or the high voltage. When the first memory cell 100 is not selected to perform a programming activity, the semiconductor region 104 receives the high voltage, the first bit line BL1 is electrically floating, the first word line WL1 receives the middle voltage or the high voltage, and the first select line SL1 receives a low voltage. When the first memory cell 100 is selected to perform an erasing activity, the semiconductor region 104 receives the high voltage, the first bit line BL1 receives the grounding voltage, the first word line WL1 receives the high voltage or the middle voltage, and the first select line SL1 receives the high voltage. When the first memory cell 100 is not selected to perform an erasing activity, the semiconductor region 104 receives the high voltage, the first bit line BL1 is electrically floating, the first word line WL1 receives the high voltage or the middle voltage, and the first select line SL1 receives the low voltage. When the first memory cell 100 is selected to perform a reading activity, the semiconductor region 104 and the first bit line BL1 receive the middle voltage and the first word line WL1 and the first select line SL1 receive the low voltage. When the first memory cell 100 is not selected to perform a reading activity, the semiconductor region 104 and the first word line WL1 receive the middle voltage, the first bit line BL1 receives the low voltage, and the first select line SL1 is electrically floating. In the foregoing operation, the high voltage is higher than the middle voltage, the middle voltage is higher than the low voltage, and the low voltage is higher than the grounding voltage. Specifically, the high voltage is slightly lower than the source-to-drain breakdown voltage of the first field-effect transistor T1. That is to say, the high voltage is equal to the source-to-drain breakdown voltage of the first field-effect transistor T1 plus the threshold voltage of the first field-effect transistor T1. The middle voltage is equal to the source-to-drain breakdown voltage of the first field-effect transistor T1×0.5. The low voltage is equal to the source-to-drain breakdown voltage of the first field-effect transistor T1×0.25. The grounding voltage is a zero voltage. Based on the forgoing operation, the first memory cell 100 reads the current from the source of the first field-effect transistor T1 to identify the present storage state rather than read the current from the drain where high-voltage operation is performed, in order to reduce the impact of electrons entering the gate to change the threshold voltage. Compared with the Fowler-Nordheim tunneling, the read-only memory array 1 can use a lower voltage to achieve high-speed writing and multi-write purposes.

Please refer to FIG. 2, FIG. 5, and FIG. 8. In the embodiment, the first conductivity type is an N type and the second conductivity type is a P type. The operation of the second memory cell 101 is introduced as follows. The operation includes a programming activity, an erasing activity, and a reading activity. The select line or the word line is coupled to a middle voltage or a high voltage depending on process characteristics.

When the second memory cell 101 is selected to perform a programming activity, the semiconductor region 104 receives a high voltage, the second bit line BL2 and the first word line WL1 receive a grounding voltage, and the first select line SL1 receives a middle voltage or the high voltage. When the second memory cell 101 is not selected to perform a programming activity, the semiconductor region 104 receives the high voltage, the second bit line BL2 is electrically floating, the first word line WL1 receives the middle voltage or the high voltage, and the first select line SL1 receives a low voltage. When the second memory cell 101 is selected to perform an erasing activity, the semiconductor region 104 receives the high voltage, the second bit line BL2 receives the grounding voltage, the first word line WL1 receives the high voltage or the middle voltage, and the first select line SL1 receives the high voltage. When the second memory cell 101 is not selected to perform an erasing activity, the semiconductor region 104 receives the high voltage, the second bit line BL2 is electrically floating, the first word line WL1 receives the high voltage or the middle voltage, and the first select line SL1 receives the low voltage. When the second memory cell 101 is selected to perform a reading activity, the semiconductor region 104 and the second bit line BL2 receive the middle voltage and the first word line WL1 and the first select line SL1 receive the low voltage. When the second memory cell 101 is not selected to perform a reading activity, the semiconductor region 104 and the first word line WL1 receive the middle voltage, the second bit line BL2 receives the low voltage, and the first select line SL1 is electrically floating. In the foregoing operation, the high voltage is higher than the middle voltage, the middle voltage is higher than the low voltage, and the low voltage is higher than the grounding voltage. Specifically, the high voltage is slightly lower than the source-to-drain breakdown voltage of the second field-effect transistor T2. That is to say, the high voltage is equal to the source-to-drain breakdown voltage of the second field-effect transistor T2 plus the threshold voltage of the second field-effect transistor T2. The middle voltage is equal to the source-to-drain breakdown voltage of the second field-effect transistor T2×0.5. The low voltage is equal to the source-to-drain breakdown voltage of the second field-effect transistor T2×0.25. The grounding voltage is a zero voltage. Based on the forgoing operation, the second memory cell 101 reads the current from the source of the second field-effect transistor T2 to identify the present storage state rather than read the current from the drain where high-voltage operation is performed, in order to reduce the impact of electrons entering the gate to change the threshold voltage. Compared with the Fowler-Nordheim tunneling, the read-only memory array 1 can use a lower voltage to achieve high-speed writing and multi-write purposes.

Please refer to FIG. 2, FIG. 6, and FIG. 8. In the embodiment, the first conductivity type is an N type and the second conductivity type is a P type. The operation of the third memory cell 102 is introduced as follows. The operation includes a programming activity, an erasing activity, and a reading activity. The select line or the word line is coupled to a middle voltage or a high voltage depending on process characteristics.

When the third memory cell 102 is selected to perform a programming activity, the semiconductor region 104 receives a high voltage, the third bit line BL3 and the first word line WL1 receive a grounding voltage, and the second select line SL2 receives a middle voltage or the high voltage. When the third memory cell 102 is not selected to perform a programming activity, the semiconductor region 104 receives the high voltage, the third bit line BL3 is electrically floating, the first word line WL1 receives the middle voltage or the high voltage, and the second select line SL2 receives a low voltage. When the third memory cell 102 is selected to perform an erasing activity, the semiconductor region 104 receives the high voltage, the third bit line BL3 receives the grounding voltage, the first word line WL1 receives the high voltage or the middle voltage, and the second select line SL2 receives the high voltage. When the third memory cell 102 is not selected to perform an erasing activity, the semiconductor region 104 receives the high voltage, the third bit line BL3 is electrically floating, the first word line WL1 receives the high voltage or the middle voltage, and the second select line SL2 receives the low voltage. When the third memory cell 102 is selected to perform a reading activity, the semiconductor region 104 and the third bit line BL3 receive the middle voltage and the first word line WL1 and the second select line SL2 receive the low voltage. When the third memory cell 102 is not selected to perform a reading activity, the semiconductor region 104 and the first word line WL1 receive the middle voltage, the third bit line BL3 receives the low voltage, and the second select line SL2 is electrically floating. In the foregoing operation, the high voltage is higher than the middle voltage, the middle voltage is higher than the low voltage, and the low voltage is higher than the grounding voltage. Specifically, the high voltage is slightly lower than the source-to-drain breakdown voltage of the third field-effect transistor T3. That is to say, the high voltage is equal to the drain-to-source breakdown voltage of the third field-effect transistor T3 plus the threshold voltage of the third field-effect transistor T3. The middle voltage is equal to the source-to-drain breakdown voltage of the third field-effect transistor T3×0.5. The low voltage is equal to the source-to-drain breakdown voltage of the third field-effect transistor T3×0.25. The grounding voltage is a zero voltage. Based on the forgoing operation, the third memory cell 102 reads the current from the source of the third field-effect transistor T3 to identify the present storage state rather than read the current from the drain where high-voltage operation is performed, in order to reduce the impact of electrons entering the gate to change the threshold voltage. Compared with the Fowler-Nordheim tunneling, the read-only memory array 1 can use a lower voltage to achieve high-speed writing and multi-write purposes.

Please refer to FIG. 2, FIG. 7, and FIG. 8. In the embodiment, the first conductivity type is an N type and the second conductivity type is a P type. The operation of the fourth memory cell 103 is introduced as follows. The operation includes a programming activity, an erasing activity, and a reading activity. The select line or the word line is coupled to a middle voltage or a high voltage depending on process characteristics.

When the fourth memory cell 103 is selected to perform a programming activity, the semiconductor region 104 receives a high voltage, the fourth bit line BL4 and the first word line WL1 receive a grounding voltage, and the second select line SL2 receives a middle voltage or the high voltage. When the fourth memory cell 103 is not selected to perform a programming activity, the semiconductor region 104 receives the high voltage, the fourth bit line BL4 is electrically floating, the first word line WL1 receives the middle voltage or the high voltage, and the second select line SL2 receives a low voltage. When the fourth memory cell 103 is selected to perform an erasing activity, the semiconductor region 104 receives the high voltage, the fourth bit line BL4 receives the grounding voltage, the first word line WL1 receives the high voltage or the middle voltage, and the second select line SL2 receives the high voltage. When the fourth memory cell 103 is not selected to perform an erasing activity, the semiconductor region 104 receives the high voltage, the fourth bit line BL4 is electrically floating, the first word line WL1 receives the high voltage or the middle voltage, and the second select line SL2 receives the low voltage. When the fourth memory cell 103 is selected to perform a reading activity, the semiconductor region 104 and the fourth bit line BL4 receive the middle voltage and the first word line WL1 and the second select line SL2 receive the low voltage. When the fourth memory cell 103 is not selected to perform a reading activity, the semiconductor region 104 and the first word line WL1 receive the middle voltage, the fourth bit line BL4 receives the low voltage, and the second select line SL2 is electrically floating. In the foregoing operation, the high voltage is higher than the middle voltage, the middle voltage is higher than the low voltage, and the low voltage is higher than the grounding voltage. Specifically, the high voltage is slightly lower than the source-to-drain breakdown voltage of the fourth field-effect transistor T4. That is to say, the high voltage is equal to the source-to-drain breakdown voltage of the fourth field-effect transistor T4 plus the threshold voltage of the fourth field-effect transistor T4. The middle voltage is equal to the source-to-drain breakdown voltage of the fourth field-effect transistor T4×0.5. The low voltage is equal to the source-to-drain breakdown voltage of the fourth field-effect transistor T4×0.25. The grounding voltage is a zero voltage. Based on the forgoing operation, the fourth memory cell 103 reads the current from the source of the fourth field-effect transistor T4 to identify the present storage state rather than read the current from the drain where high-voltage operation is performed, in order to reduce the impact of electrons entering the gate to change the threshold voltage. Compared with the Fowler-Nordheim tunneling, the read-only memory array 1 can use a lower voltage to achieve high-speed writing and multi-write purposes.

Figures 9, 10:
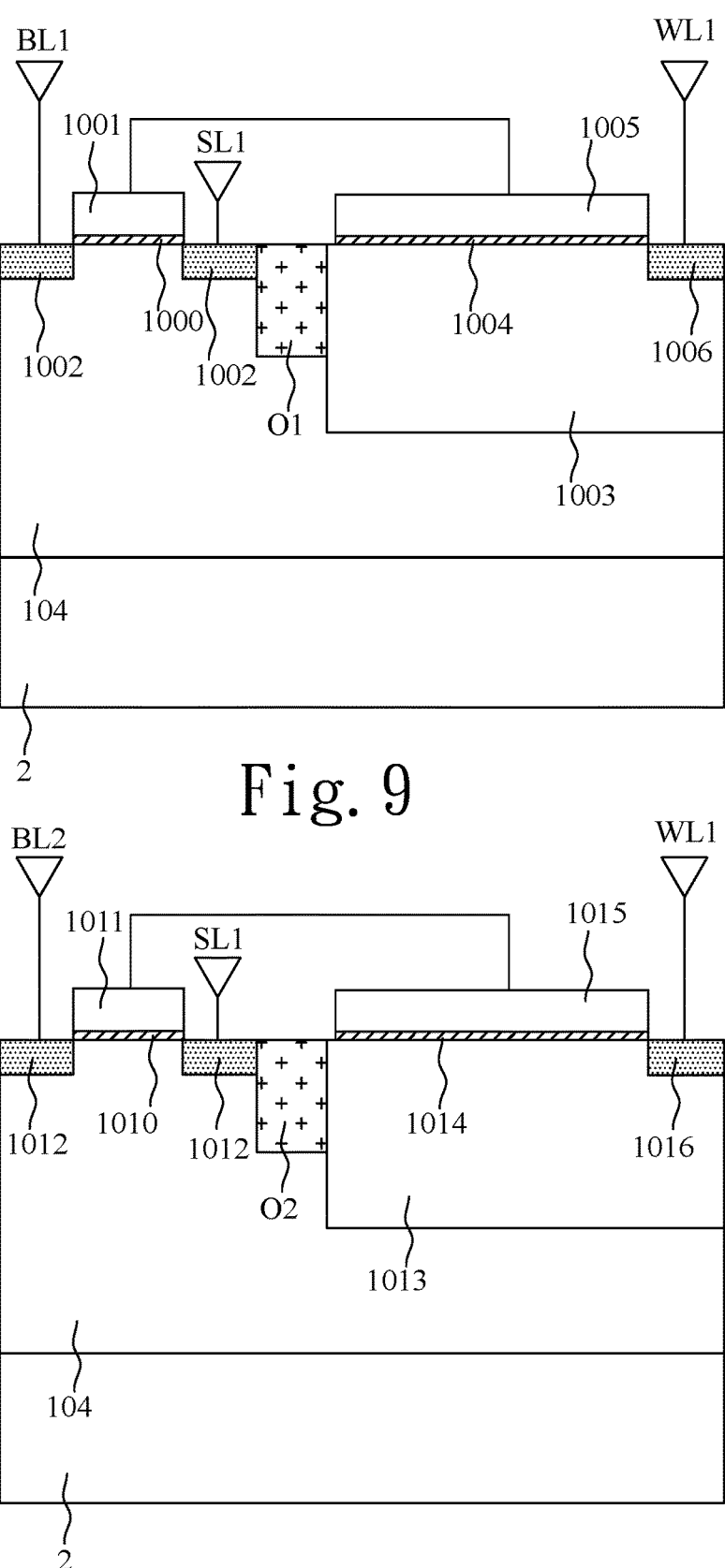
FIG. 9 is a cross-sectional view of a first memory cell according to another embodiment of the present invention.
FIG. 10 is a cross-sectional view of a second memory cell according to another embodiment of the present invention.
Figures 11, 12:
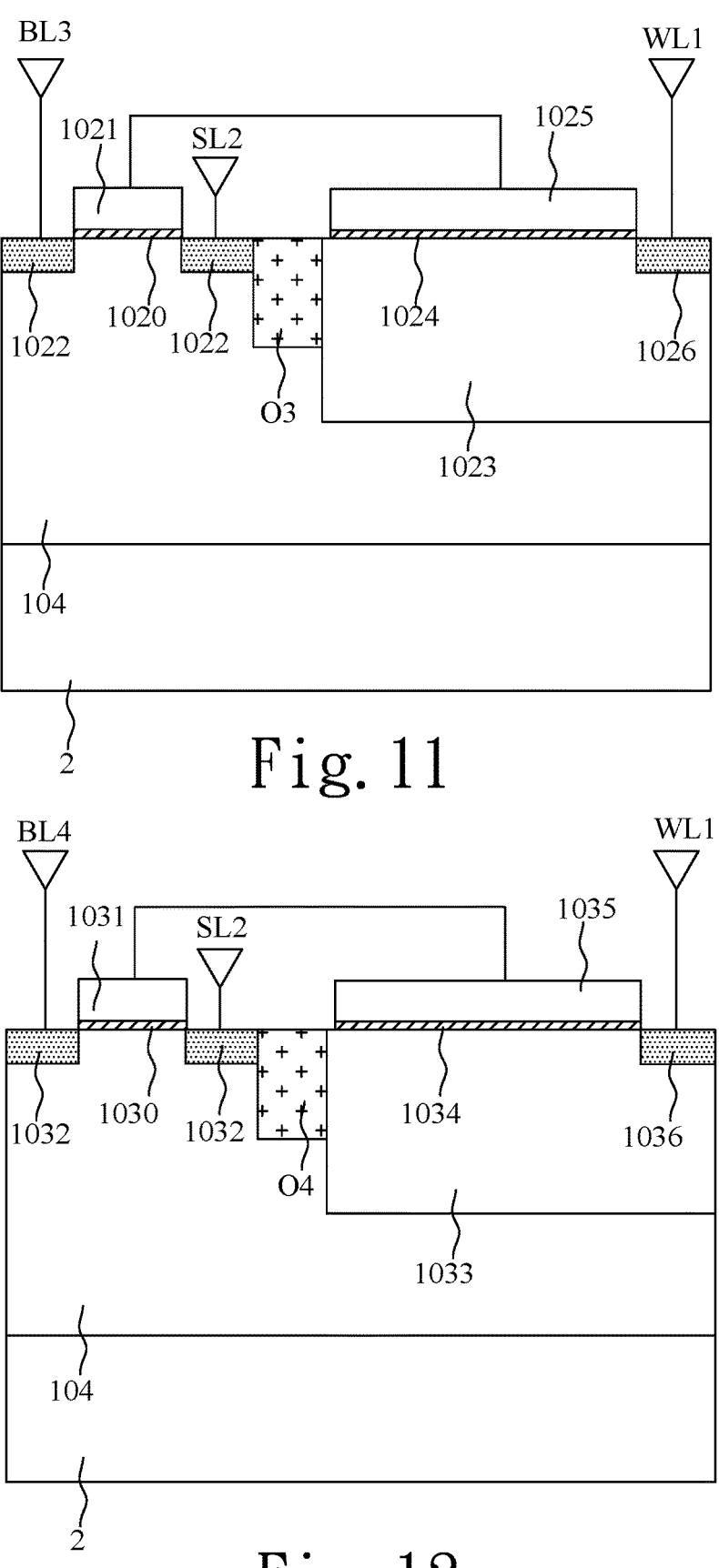
FIG. 11 is a cross-sectional view of a third memory cell according to another embodiment of the present invention.
FIG. 12 is a cross-sectional view of a fourth memory cell according to another embodiment of the present invention.

FIG. 9 is a cross-sectional view of a first memory cell according to another embodiment of the present invention. FIG. 10 is a cross-sectional view of a second memory cell according to another embodiment of the present invention. FIG. 11 is a cross-sectional view of a third memory cell according to another embodiment of the present invention. FIG. 12 is a cross-sectional view of a fourth memory cell according to another embodiment of the present invention. Please refer to FIG. 9, FIG. 10, FIG. 11, and FIG. 12. The first memory cell 100, the second memory cell 101, the third memory cell 102, and the fourth memory cell 103 may be formed in the semiconductor region 104 implemented with a semiconductor epitaxial layer formed on a semiconductor substrate. The other structures have been described previously so it will not be reiterated.

According to the embodiments provided above, the read only memory array can use a lower voltage to achieve high-speed writing and multi-write purposes.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A high-speed multi-write read only memory array comprising:

a plurality of word lines, arranged in parallel, comprising a first word line;

a plurality of select lines arranged in parallel, wherein the plurality of select lines perpendicular to the plurality of word lines comprise a first select line and a second select line;

a plurality of bit lines arranged in parallel, wherein the plurality of bit lines parallel to the plurality of select lines comprise a first bit line, a second bit line, a third bit line, and a fourth bit line, the first select line is arranged between the first bit line and the second bit line, and the second select line is arranged between the third bit line and the fourth bit line; and a plurality of sub-memory arrays each coupled to one of the plurality of word lines, two of the plurality of select lines, and four of the plurality of bit lines, wherein each of the plurality of sub-memory arrays comprises:

a first memory cell coupled to the first word line, the first bit line, and the first select line;

a second memory cell coupled to the first word line, the second bit line, and the first select line;

a third memory cell coupled to the first word line, the third bit line, and the second select line; and a fourth memory cell coupled to the first word line, the fourth bit line, and the second select line.

2. The high-speed multi-write read only memory array according to claim 1, wherein the first memory cell and the second memory cell are arranged symmetric to each other, the first memory cell and the third memory cell are arranged symmetric to each other, the fourth memory cell and the second memory cell are arranged symmetric to each other, and the fourth memory cell and the third memory cell are arranged symmetric to each other.

3. The high-speed multi-write read only memory array according to claim 2, wherein the first memory cell, the second memory cell, the third memory cell, and the fourth memory cell are formed in a semiconductor region having a first conductivity type and the first memory cell comprises:

a first field-effect transistor, formed in the semiconductor region, comprises:

a first gate dielectric block formed on the semiconductor region;

a first conduction gate formed on the first gate dielectric block; and two first heavily-doped regions formed in the semiconductor region and respectively formed on two opposite side of the semiconductor region, which is directly arranged under the first conduction gate, wherein the first heavily-doped regions, respectively coupled to the first bit line and the first select line, have a second conductivity type opposite to the first conductivity type; and a first capacitor structure, formed in the semiconductor region, separating from the first field-effect transistor and comprising:

a first well, formed in the semiconductor region and coupled to the first word line, having the second conductivity type;

a first dielectric block formed on a surface of the first well; and a first electrode block stacked on the first dielectric block and coupled to the first conduction gate.

4. The high-speed multi-write read only memory array according to claim 3, wherein the second memory cell comprises:

a second field-effect transistor, formed in the semiconductor region, comprises:

a second gate dielectric block formed on the semiconductor region;

a second conduction gate formed on the second gate dielectric block; and two second heavily-doped regions formed in the semiconductor region and respectively formed on two opposite side of the semiconductor region, which is directly arranged under the second conduction gate, wherein the second heavily-doped regions, respectively coupled to the second bit line and the first select line, have the second conductivity type; and a second capacitor structure, formed in the semiconductor region, separating from the second field-effect transistor and comprising:

a second well, formed in the semiconductor region and coupled to the first word line, having the second conductivity type;

a second dielectric block formed on a surface of the second well; and a second electrode block stacked on the second dielectric block and coupled to the second conduction gate.

5. The high-speed multi-write read only memory array according to claim 4, wherein the third memory cell comprises:

a third field-effect transistor, formed in the semiconductor region, comprises:

a third gate dielectric block formed on the semiconductor region;

a third conduction gate formed on the third gate dielectric block; and two third heavily-doped regions formed in the semiconductor region and respectively formed on two opposite side of the semiconductor region, which is directly arranged under the third conduction gate, wherein the third heavily-doped regions, respectively coupled to the third bit line and the second select line, have the second conductivity type; and a third capacitor structure, formed in the semiconductor region, separating from the third field-effect transistor and comprising:

a third well, formed in the semiconductor region and coupled to the first word line, having the second conductivity type;

a third dielectric block formed on a surface of the third well; and a third electrode block stacked on the third dielectric block and coupled to the third conduction gate.

6. The high-speed multi-write read only memory array according to claim 5, wherein the fourth memory cell comprises:

a fourth field-effect transistor, formed in the semiconductor region, comprises:

a fourth gate dielectric block formed on the semiconductor region;

a fourth conduction gate formed on the fourth gate dielectric block; and two fourth heavily-doped regions formed in the semiconductor region and respectively formed on two opposite side of the semiconductor region, which is directly arranged under the fourth conduction gate, wherein the fourth heavily-doped regions, respectively coupled to the fourth bit line and the second select line, have the second conductivity type; and a fourth capacitor structure, formed in the semiconductor region, separating from the fourth field-effect transistor and comprising:

a fourth well, formed in the semiconductor region and coupled to the first word line, having the second conductivity type;

a fourth dielectric block formed on a surface of the fourth well; and a fourth electrode block stacked on the fourth dielectric block and coupled to the fourth conduction gate.

7. The high-speed multi-write read only memory array according to claim 6, wherein the first conductivity type is a P type and the second conductivity type is an N type.

8. The high-speed multi-write read only memory array according to claim 7, wherein when the first memory cell is selected to perform a programming activity, the semiconductor region receives a grounding voltage, the first bit line and the first word line receive a high voltage, and the first select line receives a low voltage or the grounding voltage, the high voltage is higher than the low voltage, and the low voltage is higher than the grounding voltage.

9. The high-speed multi-write read only memory array according to claim 7, wherein when the first memory cell is not selected to perform a programming activity, the semiconductor region receives a grounding voltage, the first bit line is electrically floating, the first word line receives a low voltage or the grounding voltage, and the first select line receives a middle voltage, the middle voltage is higher than the low voltage, and the low voltage is higher than the grounding voltage.

10. The high-speed multi-write read only memory array according to claim 7, wherein when the second memory cell is selected to perform a programming activity, the semiconductor region receives a grounding voltage, the second bit line and the first word line receive a high voltage, and the first select line receives a low voltage or the grounding voltage, the high voltage is higher than the low voltage, and the low voltage is higher than the grounding voltage.

11. The high-speed multi-write read only memory array according to claim 7, wherein when the second memory cell is not selected to perform a programming activity, the semiconductor region receives a grounding voltage, the second bit line is electrically floating, the first word line receives a low voltage or the grounding voltage, and the first select line receives a middle voltage, the middle voltage is higher than the low voltage, and the low voltage is higher than the grounding voltage.

12. The high-speed multi-write read only memory array according to claim 7, wherein when the third memory cell is selected to perform a programming activity, the semiconductor region receives a grounding voltage, the third bit line and the first word line receive a high voltage, and the second select line receives a low voltage or the grounding voltage, the high voltage is higher than the low voltage, and the low voltage is higher than the grounding voltage.

13. The high-speed multi-write read only memory array according to claim 7, wherein when the third memory cell is not selected to perform a programming activity, the semiconductor region receives a grounding voltage, the third bit line is electrically floating, the first word line receives a low voltage or the grounding voltage, and the second select line receives a middle voltage, the middle voltage is higher than the low voltage, and the low voltage is higher than the grounding voltage.

14. The high-speed multi-write read only memory array according to claim 7, wherein when the fourth memory cell is selected to perform a programming activity, the semiconductor region receives a grounding voltage, the fourth bit line and the first word line receive a high voltage, and the second select line receives a low voltage or the grounding voltage, the high voltage is higher than the low voltage, and the low voltage is higher than the grounding voltage.

15. The high-speed multi-write read only memory array according to claim 7, wherein when the fourth memory cell is not selected to perform a programming activity, the semiconductor region receives a grounding voltage, the fourth bit line is electrically floating, the first word line receives a low voltage or the grounding voltage, and the second select line receives a middle voltage, the middle voltage is higher than the low voltage, and the low voltage is higher than the grounding voltage.

16. The high-speed multi-write read only memory array according to claim 7, wherein when the first memory cell is selected to perform an erasing activity, the semiconductor region receives a grounding voltage, the first bit line receives a high voltage, the first word line receives the grounding voltage or a low voltage, and the first select line receives the grounding voltage, the high voltage is higher than the low voltage, and the low voltage is higher than the grounding voltage.

17. The high-speed multi-write read only memory array according to claim 7, wherein when the first memory cell is not selected to perform an erasing activity, the semiconductor region receives a grounding voltage, the first bit line is electrically floating, the first word line receives the grounding voltage or a low voltage, and the first select line receives a middle voltage, the middle voltage is higher than the low voltage, and the low voltage is higher than the grounding voltage.

18. The high-speed multi-write read only memory array according to claim 7, wherein when the second memory cell is selected to perform an erasing activity, the semiconductor region receives a grounding voltage, the second bit line receives a high voltage, the first word line receives the grounding voltage or a low voltage, and the first select line receives the grounding voltage, the high voltage is higher than the low voltage, and the low voltage is higher than the grounding voltage.

19. The high-speed multi-write read only memory array according to claim 7, wherein when the second memory cell is not selected to perform an erasing activity, the semiconductor region receives a grounding voltage, the second bit line is electrically floating, the first word line receives the grounding voltage or a low voltage, and the first select line receives a middle voltage, the middle voltage is higher than the low voltage, and the low voltage is higher than the grounding voltage.

20. The high-speed multi-write read only memory array according to claim 7, wherein when the third memory cell is selected to perform an erasing activity, the semiconductor region receives a grounding voltage, the third bit line receives a high voltage, the first word line receives the grounding voltage or a low voltage, and the second select line receives the grounding voltage, the high voltage is higher than the low voltage, and the low voltage is higher than the grounding voltage.

21. The high-speed multi-write read only memory array according to claim 7, wherein when the third memory cell is not selected to perform an erasing activity, the semiconductor region receives a grounding voltage, the third bit line is electrically floating, the first word line receives the grounding voltage or a low voltage, and the second select line receives a middle voltage, the middle voltage is higher than the low voltage, and the low voltage is higher than the grounding voltage.

22. The high-speed multi-write read only memory array according to claim 7, wherein when the fourth memory cell is selected to perform an erasing activity, the semiconductor region receives a grounding voltage, the fourth bit line receives a high voltage, the first word line receives the grounding voltage or a low voltage, and the second select line receives the grounding voltage, the high voltage is higher than the low voltage, and the low voltage is higher than the grounding voltage.

23. The high-speed multi-write read only memory array according to claim 7, wherein when the fourth memory cell is not selected to perform an erasing activity, the semiconductor region receives a grounding voltage, the fourth bit line is electrically floating, the first word line receives the grounding voltage or a low voltage, and the second select line receives a middle voltage, the middle voltage is higher than the low voltage, and the low voltage is higher than the grounding voltage.

24. The high-speed multi-write read only memory array according to claim 7, wherein when the first memory cell is selected to perform a reading activity, the semiconductor region and the first bit line receive a grounding voltage and the first word line and the first select line receive a low voltage, and the low voltage is higher than the grounding voltage.

25. The high-speed multi-write read only memory array according to claim 7, wherein when the first memory cell is not selected to perform a reading activity, the semiconductor region and the first word line receive a grounding voltage, the first bit line receives a low voltage, and the first select line is electrically floating, and the low voltage is higher than the grounding voltage.

26. The high-speed multi-write read only memory array according to claim 7, wherein when the second memory cell is selected to perform a reading activity, the semiconductor region and the second bit line receive a grounding voltage and the first word line and the first select line receive a low voltage, and the low voltage is higher than the grounding voltage.

27. The high-speed multi-write read only memory array according to claim 7, wherein when the second memory cell is not selected to perform a reading activity, the semiconductor region and the first word line receive a grounding voltage, the second bit line receives a low voltage, and the first select line is electrically floating, and the low voltage is higher than the grounding voltage.

28. The high-speed multi-write read only memory array according to claim 7, wherein when the third memory cell is selected to perform a reading activity, the semiconductor region and the third bit line receive a grounding voltage and the first word line and the second select line receive a low voltage, and the low voltage is higher than the grounding voltage.

29. The high-speed multi-write read only memory array according to claim 7, wherein when the third memory cell is not selected to perform a reading activity, the semiconductor region and the first word line receive a grounding voltage, the third bit line receives a low voltage, and the second select line is electrically floating, and the low voltage is higher than the grounding voltage.

30. The high-speed multi-write read only memory array according to claim 7, wherein when the fourth memory cell is selected to perform a reading activity, the semiconductor region and the fourth bit line receive a grounding voltage and the first word line and the second select line receive a low voltage, and the low voltage is higher than the grounding voltage.

31. The high-speed multi-write read only memory array according to claim 7, wherein when the fourth memory cell is not selected to perform a reading activity, the semiconductor region and the first word line receive a grounding voltage, the fourth bit line receives a low voltage, and the second select line is electrically floating, and the low voltage is higher than the grounding voltage.

32. The high-speed multi-write read only memory array according to claim 6, wherein the first conductivity type is an N type and the second conductivity type is a P type.

33. The high-speed multi-write read only memory array according to claim 32, wherein when the first memory cell is selected to perform a programming activity, the semiconductor region receives a high voltage, the first bit line and the first word line receive a grounding voltage, and the first select line receives a middle voltage or the high voltage, the high voltage is higher than the middle voltage, and the middle voltage is higher than the grounding voltage.

34. The high-speed multi-write read only memory array according to claim 32, wherein when the first memory cell is not selected to perform a programming activity, the semiconductor region receives a high voltage, the first bit line is electrically floating, the first word line receives a middle voltage or the high voltage, and the first select line receives a low voltage, the high voltage is higher than the middle voltage, and the middle voltage is higher than the low voltage.

35. The high-speed multi-write read only memory array according to claim 32, wherein when the second memory cell is selected to perform a programming activity, the semiconductor region receives a high voltage, the second bit line and the first word line receive a grounding voltage, and the first select line receives a middle voltage or the high voltage, the high voltage is higher than the middle voltage, and the middle voltage is higher than the grounding voltage.

36. The high-speed multi-write read only memory array according to claim 32, wherein when the second memory cell is not selected to perform a programming activity, the semiconductor region receives a high voltage, the second bit line is electrically floating, the first word line receives a middle voltage or the high voltage, and the first select line receives a low voltage, the high voltage is higher than the middle voltage, and the middle voltage is higher than the low voltage.

37. The high-speed multi-write read only memory array according to claim 32, wherein when the third memory cell is selected to perform a programming activity, the semiconductor region receives a high voltage, the third bit line and the first word line receive a grounding voltage, and the second select line receives a middle voltage or the high voltage, the high voltage is higher than the middle voltage, and the middle voltage is higher than the grounding voltage.

38. The high-speed multi-write read only memory array according to claim 32, wherein when the third memory cell is not selected to perform a programming activity, the semiconductor region receives a high voltage, the third bit line is electrically floating, the first word line receives a middle voltage or the high voltage, and the second select line receives a low voltage, the high voltage is higher than the middle voltage, and the middle voltage is higher than the low voltage.

39. The high-speed multi-write read only memory array according to claim 32, wherein when the fourth memory cell is selected to perform a programming activity, the semiconductor region receives a high voltage, the fourth bit line and the first word line receive a grounding voltage, and the second select line receives a middle voltage or the high voltage, the high voltage is higher than the middle voltage, and the middle voltage is higher than the grounding voltage.

40. The high-speed multi-write read only memory array according to claim 32, wherein when the fourth memory cell is not selected to perform a programming activity, the semiconductor region receives a high voltage, the fourth bit line is electrically floating, the first word line receives a middle voltage or the high voltage, and the second select line receives a low voltage, the high voltage is higher than the middle voltage, and the middle voltage is higher than the low voltage.

41. The high-speed multi-write read only memory array according to claim 32, wherein when the first memory cell is selected to perform an erasing activity, the semiconductor region receives a high voltage, the first bit line receives a grounding voltage, the first word line receives the high voltage or a middle voltage, and the first select line receives the high voltage, the high voltage is higher than the middle voltage, and the middle voltage is higher than the grounding voltage.

42. The high-speed multi-write read only memory array according to claim 32, wherein when the first memory cell is not selected to perform an erasing activity, the semiconductor region receives a high voltage, the first bit line is electrically floating, the first word line receives the high voltage or a middle voltage, and the first select line receives a low voltage, the high voltage is higher than the middle voltage, and the middle voltage is higher than the low voltage.

43. The high-speed multi-write read only memory array according to claim 32, wherein when the second memory cell is selected to perform an erasing activity, the semiconductor region receives a high voltage, the second bit line receives a grounding voltage, the first word line receives the high voltage or a middle voltage, and the first select line receives the high voltage, the high voltage is higher than the middle voltage, and the middle voltage is higher than the grounding voltage.

44. The high-speed multi-write read only memory array according to claim 32, wherein when the second memory cell is not selected to perform an erasing activity, the semiconductor region receives a high voltage, the second bit line is electrically floating, the first word line receives the high voltage or a middle voltage, and the first select line receives a low voltage, the high voltage is higher than the middle voltage, and the middle voltage is higher than the low voltage.

45. The high-speed multi-write read only memory array according to claim 32, wherein when the third memory cell is selected to perform an erasing activity, the semiconductor region receives a high voltage, the third bit line receives a grounding voltage, the first word line receives the high voltage or a middle voltage, and the second select line receives the high voltage, the high voltage is higher than the middle voltage, and the middle voltage is higher than the grounding voltage.

46. The high-speed multi-write read only memory array according to claim 32, wherein when the third memory cell is not selected to perform an erasing activity, the semiconductor region receives a high voltage, the third bit line is electrically floating, the first word line receives the high voltage or a middle voltage, and the second select line receives a low voltage, the high voltage is higher than the middle voltage, and the middle voltage is higher than the low voltage.

47. The high-speed multi-write read only memory array according to claim 32, wherein when the fourth memory cell is selected to perform an erasing activity, the semiconductor region receives a high voltage, the fourth bit line receives a grounding voltage, the first word line receives the high voltage or a middle voltage, and the second select line receives the high voltage, the high voltage is higher than the middle voltage, and the middle voltage is higher than the grounding voltage.

48. The high-speed multi-write read only memory array according to claim 32, wherein when the fourth memory cell is not selected to perform an erasing activity, the semiconductor region receives a high voltage, the fourth bit line is electrically floating, the first word line receives the high voltage or a middle voltage, and the second select line receives a low voltage, the high voltage is higher than the middle voltage, and the middle voltage is higher than the low voltage.

49. The high-speed multi-write read only memory array according to claim 32, wherein when the first memory cell is selected to perform a reading activity, the semiconductor region and the first bit line receive a middle voltage and the first word line and the first select line receive a low voltage, and the middle voltage is higher than the low voltage.

50. The high-speed multi-write read only memory array according to claim 32, wherein when the first memory cell is not selected to perform a reading activity, the semiconductor region and the first word line receive a middle voltage, the first bit line receives a low voltage, and the first select line is electrically floating, and the middle voltage is higher than the low voltage.

51. The high-speed multi-write read only memory array according to claim 32, wherein when the second memory cell is selected to perform a reading activity, the semiconductor region and the second bit line receive a middle voltage and the first word line and the first select line receive a low voltage, and the middle voltage is higher than the low voltage.

52. The high-speed multi-write read only memory array according to claim 32, wherein when the second memory cell is not selected to perform a reading activity, the semiconductor region and the first word line receive a middle voltage, the second bit line receives a low voltage, and the first select line is electrically floating, and the middle voltage is higher than the low voltage.

53. The high-speed multi-write read only memory array according to claim 32, wherein when the third memory cell is selected to perform a reading activity, the semiconductor region and the third bit line receive a middle voltage and the first word line and the second select line receive a low voltage, and the middle voltage is higher than the low voltage.

54. The high-speed multi-write read only memory array according to claim 32, wherein when the third memory cell is not selected to perform a reading activity, the semiconductor region and the first word line receive a middle voltage, the third bit line receives a low voltage, and the second select line is electrically floating, and the middle voltage is higher than the low voltage.

55. The high-speed multi-write read only memory array according to claim 32, wherein when the fourth memory cell is selected to perform a reading activity, the semiconductor region and the fourth bit line receive a middle voltage and the first word line and the second select line receive a low voltage, and the middle voltage is higher than the low voltage.

56. The high-speed multi-write read only memory array according to claim 32, wherein when the fourth memory cell is not selected to perform a reading activity, the semiconductor region and the first word line receive a middle voltage, the fourth bit line receives a low voltage, and the second select line is electrically floating, and the middle voltage is higher than the low voltage.

57. The high-speed multi-write read only memory array according to claim 3, wherein the semiconductor region is a semiconductor substrate or a semiconductor epitaxial layer formed on a semiconductor substrate.

* * * * *